United States Patent [19]

Nagai et al.

[11] Patent Number: 5,065,285
[45] Date of Patent: Nov. 12, 1991

[54] MULTI-LAYER CIRCUIT BOARD, METHOD OF MANUFACTURING THE SAME AND APPLICATION THEREOF

[75] Inventors: Akira Nagai; Katuo Sugawara, both of Hitachi; Masahiro Suzuki, Iwaki; Junichi Katagiri, Ibaraki; Akio Takahashi, Hitachiota, all of Japan

[73] Assignee: Hitachi, Ltd., Tokyo, Japan

[21] Appl. No.: 489,549

[22] Filed: Mar. 7, 1990

[30] Foreign Application Priority Data

Mar. 10, 1989 [JP] Japan .................................. 1-056488

[51] Int. Cl.⁵ ............................................... H05K 1/11
[52] U.S. Cl. .................................................... 361/414
[58] Field of Search ............... 361/386, 393, 397, 398, 361/401, 412, 414, 419; 174/250, 255, 259, 261, 262; 439/44, 65, 69, 74; 428/241

[56] References Cited

U.S. PATENT DOCUMENTS

| 3,952,231 | 4/1976 | Davidson et al. | 361/386 |
| 4,626,961 | 12/1986 | Ono et al. | 361/388 |
| 4,774,632 | 9/1988 | Neugebauer | 357/79 |

Primary Examiner—Leo P. Picard
Assistant Examiner—Donald A. Sparks
Attorney, Agent, or Firm—Antonelli, Terry Stout & Kraus

[57] ABSTRACT

The dislocation between each layer in a multi-layer circuit board and a process for producing the same and an application of the same is minimized by employing a specific adhesive layer between layers of the circuit board. The adhesive layer is composed of a film of a resin having a melting point higher than a temperature for forming the multi-layer (or laminated layer) circuit board and adhesive having a melting point lower than the temperature for forming the multi-layer circuit board.

6 Claims, 1 Drawing Sheet

MULTI-LAYER CIRCUIT BOARD, METHOD OF MANUFACTURING THE SAME AND APPLICATION THEREOF

BACKGROUND OF THE INVENTION

1. Field of the Invention

The present invention relates to a multi-layer circuit board having layers of which relative positions are less dislocated and capable of keeping a circuit at a high precision, transmitting signals at a high speed and consuming less electric power, and to a manufacturing method of the same and application thereof.

2. Discussion On Related Art

A conventional multi-layer circuit board is generally produced by alternatively laminating and forming conductive layers and insulating layers. For example, there is a method by which inner layer members are integrally laminated through adhesive layers. Conventionally, the inner layer member is produced in such a method that half-thermosetting resin is applied to a reinforcing member such as glass fabric by impregnation to provide prepreg, the prepreg is laminated with copper foils placed on the upper and lower surfaces thereof to provide a copper bonded and laminated plate, and a circuit is formed by etching the copper foils. Further, said prepreg is used as the adhesive layer.

When the inner layer members are laminated and formed through the prepreg, a problem arises in that a lot of resin impregnated in the prepreg is flown by the pressure applied when lamination is effected, so that the respective inner layer members are dislocated with respect to each other and thus it is difficult to provide a multilayer circuit board having circuits kept precisely located therein.

In particular, as the circuit is microprocessed (to obtain a high aspect ratio), the solution of this problem is required. As a measure for solving it, there is proposed a method of laminating and bonding inner layer members including circuits whose surface is flattened by chemical plating through conventional prepreg [Japanese Patent Application KOKAI (Laid-Open) No. Sho 63-53996].

This method, however, does not sufficiently comply with the dislocation problem between the respective layers, since the prepreg is used as adhesive layers.

To solve the above problem, it is required to make the glass fabric used as the reinforcing member of the prepreg thinner to reduce an amount of the impregnated resin or to develop a new material for the adhesive layer which has an excellent reinforcing effect. There has been proposed a new reinforcing member used in place of the glass fabric which is composed of organic fiber such as polyamide, polyester, polyimide and the like.

Even if prepreg composed of the reinforcing member is employed as the adhesive layer, the problem of the dislocation between the respective layers is difficult to be solved. This is because when the glass fabric or the organic fiber sheet is used, varnish impregnated therein is flown out when it is laminated and bonded, and thus dislocation is easily caused.

OBJECT AND SUMMARY OF THE INVENTION

It is an object of the present invention to provide a multi-layer circuit board in which the problem of dislocation between layers is solved by laminating and bonding inner layer members through adhesive layers which are devised to cause no dislocation or minimize the same, and further to provide a method of manufacturing the multi-layer circuit board and application parts composed of the multi-layer circuit board manufactured by the method.

The object of the present invention is achieved such that a plurality of inner layer members each including on at least one surface thereof a conductive layer to which a circuit is formed: and said circuit having non-circuit surface on one side and on the other side substantially flattened circuit surface, are laminated and bonded through adhesive layers interposed therebetween, each of the adhesive layers being composed of a film of an organic substance which is varnish impenetrable and organic adhesive which is disposed on both surfaces thereof and has a melting temperature lower than a temperature for forming laminated layer.

Further, another object of the present invention is to provide a method of manufacturing a multi-layer circuit board comprising a plurality of inner layer members each including on at least one surface thereof a conductive layer to which a circuit is formed: said circuit having non-circuit surface on one side and circuit surface substantially flattened on the other side, and the plurality of the inner layer members being laminated and bonded through films or sheets of a varnish unpenetrating organic substance interposed therebetween, wherein each of the films or sheets is composed of an organic substance having a melting point different from that of adhesive forming the adhesive layers thereof. It is a still another object of the present invention to provide a computer having a mounting system which uses at least one of module board, microchip carrier board, and pin grid array board each having LSI elements mounted on said circuit board, or a large area composite board composed of the combination of these boards.

The multi-layer circuit board according to the present invention is generally made by, for example, the following means. Impregnating varnish mainly composed of thermosetting resin is prepared, applied to glass fabric by impregnation, and dried to obtain prepreg.

Next, a necessary number of sheets of thus obtained prepreg are overlapped and laminated by a press to obtain an insulating board. Holes are created at the prescribed portions of the insulating board to form through hole portions. Further, the surface of the board is roughed by chromic acid, sulfuric acid, $O_2$-plasma or the like to improve the adhesive property thereof with catalyst, resist, copper and the like.

Next, palladium type plating catalyst or the like is applied to thus roughed surface of the board and then resist is coated thereon to form a circuit. Copper chemical plating is effected to a recess where the circuit is formed so as to make the plated portion become the same level as that of the insulated portion composed of the resist, and the surface of the board is flattened to obtain an inner layer member.

Next, a necessary number of sheets of thus obtained inner layer members are overlapped and laminated at a prescribed pressure through films or sheets interposed therebetween each of which is composed of an organic substance and has adhesive layers formed on both surfaces thereof, whereby the multi-layer circuit board as a target product of the present invention can be formed.

Figure 1:
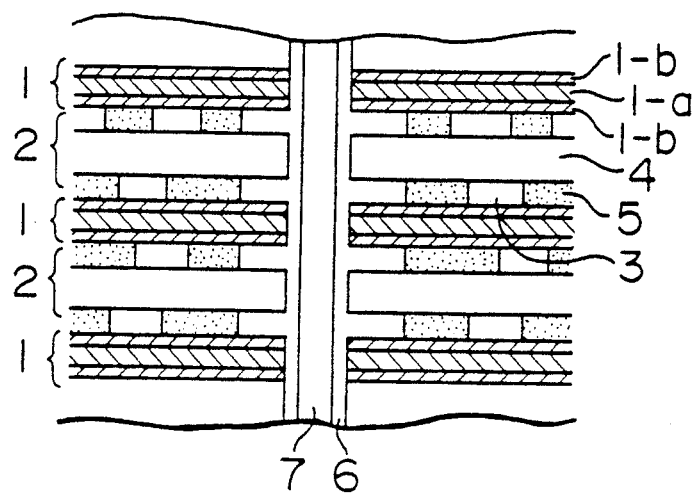
FIG. 1 is a vertical cross sectional view of a multi-layer circuit board according to the present invention.

1 . . . adhesive layer film, 1-$a$ . . . high melting point material (film or sheet main body), 1-$b$ . . . low melting point material (adhesive), 2 . . . inner layer portion, 3 . . . conductive portion, 4 . . . insulating layer, 5 . . . resist portion, 6 . . . plated portion for through hole, 7 . . . through hole, 8 . . . large are board, 9 . . . module board, 10 . . . microchip board.

PREFERRED EMBODIMENT OF THE INVENTION

A multi-layer circuit board according to the present invention is usually produced by the following means.

First, impregnating varnish mainly composed of a thermosetting resin is prepared, applied to glass fabric serving as a reinforcing member by impregnation, and dried to obtain prepreg. Well-known thermosetting resins such as epoxy resin, phenol resin, diallyl resin, unsaturated polyester resin, urethane resin, additive reaction type imide resin and the like can be used. Further, to increase the effect of the present invention, effectively used are various types of fluorine-containing resin obtained from thermosetting resin modified or substituted with or derived from a fluorine-containing compound or a resin composition to which the fluorine-containing compound is added. When the above fluorine-containing resin is used, the board has a low dielectric constant, which is effective to transmit signals at a high speed. Further, this is also effective to improve adhesion to a circuit forming metal such as copper, gold, silver, aluminum, iron-nickel alloy (42 alloy) and the like as well as to improve the moisture proof property (reduction of water absorption and permeability) of the board.

Further, the above reinforcing member composed of the prepreg is not limited to the glass fabric but may be composed of glass mat, glass paper, glass nonwoven fabric, synthetic fiber fabric, synthetic fiber, thermosetting film, and heat resistant film or sheet of polyimide, polyamide, polyester or the like.

Second, a necessary number of sheets of the thus obtained prepreg are overlapped and laminated by a press to obtain an insulating board. Holes are created at the prescribed portions of the insulating board to form through hole portions. Further, the surface of the board is roughed by chromic acid, sulfuric acid, $O_2$-plasma or the like to improve the adhesive property thereof with catalyst, resist, copper and the like.

Third, palladium type plating catalyst or the like is applied to the roughed surface of the board and then resist is coated thereon to form a circuit. Copper chemical plating is effected to a recess where the circuit is formed so as to make plated portion become the same level as that of the insulated portion composed of the resist and the surface of the board is flattened to obtain an inner layer member. Further, when the resist has a high dielectric constant, a flattened board can be also obtained in such a manner that the resist is removed by a conventional way and then thermosetting varnish having a low dielectric constant is coated. In addition to the above, a method of producing the flattened board includes a circuit transferring method, a conductor precipitating method and the like.

Fourth, a necessary number of sheets of thus obtained inner layer members are overlapped and laminated at a prescribed pressure through film or sheets interposed therebetween which are composed of an organic substance and each of which has adhesive layers formed on both surfaces thereof, whereby the multi-layer circuit board as a target product of the present invention is obtained.

The above film or sheet is composed, for example, of an organic substance having a melting point higher than a temperature for forming the laminated layer of the circuit board and adhesive having a melting point lower than the temperature for forming the laminated layer is usually disposed on both surfaces thereof. The organic substance constituting the film or sheet includes a well-known combination of thermosetting resin and thermoplastic resin.

The thermosetting resin includes, for example, epoxy resin, phenol resin, urethane resin, unsaturated polyester resin, additive reaction type imide resin, melamine resin, urea resin, silicone resin and the like. In addition, the thermoplastic resin includes polyester, polyamide, polyfluorocarbon, polyether, polyphenoxy, polybutylal, polyisobutylene, polybutadiene and the like, and a mixture thereof or modified polymer thereof may be used.

In the present invention, adhesive layers are formed on both surfaces of the organic film or sheet having the melting point higher than a temperature for forming laminated layer in a thickness by which it can be bonded to the inner layer member. The adhesive layer is composed of varnish having a melting point lower than a temperature for forming laminated layer and formed by a coating or laminating method.

In the present invention, the film or sheet having the melting point higher than a temperature for forming the laminated layer preferably has a thickness capable of achieving an insulating effect and an effect to increase mechanical strength.

Further, the film or sheet may be provided with a suitable number of holes created at the suitable positions thereof to enable the adhesive layers to be jointed together on both surfaces thereof so that the film or sheet can be jointed to the adhesive layers more strongly.

The film or sheet used in the present invention must have such properties that the thickness thereof is not essentially changed when it is processed to form a laminated layer. It is composed of an organic substance to make a multi-layer plate having a low dielectric constant. It has a thickness of about 20 $\mu$m or less.

Further, the film or sheet according to the present invention has a role serving as a reinforcing member to provide insulation between circuits in the adjacent inner layer members. If a film or sheet composed only of adhesive, which flows when the laminated layer is formed is used, there is a possibility that the circuits in the adjacent inner layer members are short circuited.

Further, in the multi-layer circuit board according to the present invention there is used a composition obtained by adding various types of fluorine-containing compounds to said thermosetting or thermoplastic resin, or fluoro-resin as a material of the film or sheet for the adhesive layer, whereby the film or sheet has a dielectric constant of 3.0 or less in the state that it has adhesive disposed thereon to permit the board to transmit signals at a high speed. In addition, the film or sheet can be provided with a water absorption of 0.5% or less, whereby the corrosion and the deterioration of electric insulating characteristics of the circuits of the multi-layer circuit board can be prevented at high temperature and under high humidity.

Further, since the multi-layer circuit board provided according to the present invention can be made thin, the characteristic impedance thereof can be made 60 ohms or less.

One of the features of the adhesive layer as the essential arrangement of a multi-layer circuit board according to the present invention is that the insulated portion between the respective layers can be securely formed, because the central portion of the film or sheet having the adhesive layers is composed of the organic substance having the melting point higher than a temperature for forming the laminated layer. In addition, since both surfaces of the film or sheet are composed of a organic substance having the melting point lower than a temperature for forming the laminated layer, the inner layer member can be simply laminated and bonded at a relatively low pressure of 20 kgf/cm² or less.

It is particularly important in the present invention that a thickness of the organic substance serving as a adhesive and having the melting point lower than a temperature for forming a laminated layer can be made very thin.

Therefore, less movement of the inner layer member is caused by the flowing of the resin when the multi-layer circuit board is formed, whereby the dislocation between the respective inner layer members can be minimized.

The thickness of the adhesive layer is 20 μm or less and, in particular, it is preferably 5 to 10 μ. When the thickness is 20 μ or more, there is a possibility that the respective layers are dislocated by the flowing of the melted resin which is caused by the pressure applied thereto when the layers are formed.

The adhesive includes fluorine-containing polymer such as a copolymer of tetrafluorothylene and hexafluorobutadiene, a copolymer of pentafluorostyrene and divinylbenzene, and a copolymer or prepolymer of pentafluorostyrene and tetrafluorovinylbenzene.

The present invention will be described below with reference to examples, but is not limited to these examples.

EXAMPLES

EXAMPLE 1

Preparation of Inner Layer member

One hundred parts by weight of 3,3-dimethyl-4,4'-dicyanamidephenylmethane was solved in 100 parts by weight of MEK, and prepolymerized at 60°–80° C. for 60 minutes to obtain varnish. Thus obtained varnish was applied to quartz-glass fabric (made by Stevens Co., Ltd., thickness: 50 μ) by impregnation and dried in air kept at a temperature of 150° C. for 10 minutes, whereby tack-free prepreg was obtained. Next, a sheet of thus obtained prepreg was cured in a press for 1 hour at a pressure of 30 kgf/cm² and a temperature of 200° C., whereby an insulating board (4 in FIG. 1) was obtained. Next, the surface of the board having holes created at the prescribed portions thereof was roughed by chromic acid, sulfuric acid or the like, and palladium type plating catalyst was applied thereto. A circuit (5 in FIG. 1) was formed to the board using permanent resist mainly composed of poly(methyl α-trifluoromethyl acrylate) and the recess thereof (3 in FIG. 1) was chemically plated by an additive method, whereby an inner layer member having flattened surfaces was obtained (2 in FIG. 1).

Preparation of Multi-layer Board

A multi-layer circuit board as a target product (FIG. 1, vertical cross sectional view) was obtained in such a manner that 10 sheets of thus obtained inner layer members and polyimide films (thickness: 10 μm, 1-a in FIG. 1) as adhesive layers interposed there-between and having layers composed of fluorine-containing polymer (a copolymer of tetrafluoroethylene and hexafluoropropylene, respective thicknesses of the upper and lower surfaces: 5 μm, 1-b in FIG. 1) applied to both surfaces thereof were bonded together to form multi-layers by treating for 1 hour at a temperature of 250° C. and a pressure of 10 kgf/cm².

EXAMPLE 2

Fifty parts by weight of 3,3'-dimethyl-4,4'-dicyanamidephenylmethane and 50 parts by weight of 3,3'-bis(trifluoromethyl)-4,4' dicyanamidephenylmethane were solved in 100 parts by weight of N,N-dimethyl formamide, and prepolymerized at 100° C. for 60 minutes to obtain varnish. Thus obtained varnish was applied to quartz-glass fabric by impregnation (product of Stevens Co., Ltd., thickness: 50 μ) and dried in air kept at a temperature of 170° C. for 10 minutes, whereby tack-free prepreg was obtained. Next, a sheet of the thus obtained prepreg was cured in a press for 1 hour at a pressure of 30 kgf/cm² and a temperature of 200° C., whereby an insulating board was obtained. Next, the board of which surface was roughed and to which holes were created and plating catalyst was applied as in EXAMPLE 1 was provided with a circuit using epoxy type resist (PROBIMER®, Ciba-Geigy A. G.) as permanent resist and the recess thereof was chemically plated by an additive method, whereby an inner layer member having flattened surfaces was obtained. A multi-layer circuit board as a target product was obtained in such a manner that 10 sheets of the above inner layer members and polyamidimide films (thickness: 3 μm) interposed therebetween and having layers composed of fluorine-containing polymer (a copolymer of tetrafluoroethylene and hexafluorobutadiene, respective thicknesses of the upper and lower surfaces: 10 μm ) applied to both surfaces thereof were bonded together to form multi-layers by treating for 1 hour at a temperature of 250° C. and a pressure of 10 kgf/cm².

EXAMPLE 3

Fifty parts by weight of 1,1,1,3,3,3-hexafluoro-2,2-bis[4(maleimidephenoxy)phenyl]propane and 50 parts by weight of poly[2,3,5,6-tetrafluoro-4-vinyl)phenylmethacrylate]were solved in 100 parts by weight of N,N-dimethylformamide, prepolymerized at 100° C. for 90 minutes, and cooled, and then 0.5 parts by weight of 2,5-dimethyl-2,5-di(t-butylperoxy) hexyne-3 was added thereto as a curing agent to obtain varnish. Thus obtained varnish was applied to polyaramid fabric by impregnation (product of Asahi Schwebel Co., Ltd., thickness: 50 μm) and dried in air kept at a temperature of 170° C. for 10 minutes, whereby tack-free prepreg was obtained. Next, a sheet of thus obtained prepreg was cured in a press for 2 hours at a pressure of 20 kgf/cm² and a temperature of 200° C., whereby an insulating board was obtained. Next, the board of which surface was roughed and to which holes were created and plating catalyst was applied as in EXAMPLE 1 was provided with a circuit using permanent resist mainly composed of a copolymer of cyclic polybutadiene and poly (p-vinylbromophenyl methacrylate) and the recess thereof was chemically plated, whereby an inner layer member having flattened surfaces was obtained. A multi-layer circuit board as a target product was obtained in such a manner that 10 sheets of thus obtained inner layer members and polyimide films (thickness: 8 μm) interposed therebetween and having adhesive layers composed of fluorine-containing polymer (a copolymerized prepolymer of pentafluorostyrene and divinylbenzene, respective thicknesses of the upper and lower surfaces: 10 μm) applied to both surfaces thereof were bonded together to form multilayers by treating for 1 hour at a temperature of 220° C. and a pressure of 15 kgf/cm².

EXAMPLE 4

One hundred parts by weight of a polymerized prepolymer of pentafluorostyrene and hexafluorobutadiene were dissolved in 100 parts by weight of methyl isobutyl ketone, and 1 part by weight of dicumylperoxide was added thereto as a curing agent to obtain varnish. The thus obtained varnish was applied to a polyimide film (product of Ube Kosan Co., Ltd., thickness: 40 μm) and dried in air kept at a temperature of 150° C. for 15 minutes, whereby tack-free prepreg was obtained. Next, a sheet of thus obtained prepreg was cured in a press for 1 hour at a pressure of 15 kgf/cm² and a temperature of 180° C., whereby an insulating board was obtained. Next, the board of which surface was roughed and to which holes were created and plating catalyst was applied as in EXAMPLE 1 was provided with a circuit using light sensitive polyimide resist. Thereafter, the resist was removed and then the varying portion thereof was filled up by being heated and cured (at 200° C. for 1 hour) using thermosetting prepolymer mainly composed of a copolymer of pentafluoroethylene and 4-vinyl-2,5-bromophenymethacrylate as coating varnish, whereby an inner layer member having flattened surfaces was obtained. A multi-layer circuit board as a target product was obtained in such a manner that 10 sheets of thus obtained inner layer members and cured tetrafluorodivinylbenzene films (thickness: 5 μm) interposed therebetween and having fluorine containing adhesive layers (copolymerized prepolymer of pentafluorostyrene and tetrafluorovinylbenzene, respective thicknesses of the upper and lower surfaces: 5 μm) applied to both surfaces thereof were bonded together to form multilayers by treating for 1 hour at a temperature of 200° C. and a pressure of 8 kgf/cm².

COMPARATIVE EXAMPLE 1

Ten sheets of inner layer members obtained in EXAMPLE 1 and each one sheet of the prepreg (thickness: 50 μm) of EXAMPLE 1 serving as an adhesive layer for the inner layer members disposed therebetween were bonded together to form multi-layers by treating for 1 hour at a pressure of 30 kgf/cm² and a temperature of 200° C., whereby a multi-layer circuit board was obtained.

Table 1 shows an amount of dislocation between the layers, a thickness of the insulating layer, a dielectric constant and the like obtained in the EXAMPLEs and the COMPARATIVE EXAMPLE as well as the result of calculation of a characteristic impedance and a transmission delay time thereof effected using the following equations:

Characteristic impedance (ohm)

$$Z_0 = \frac{60}{\sqrt{\epsilon_r}} \ln\left[\frac{1.90 \times h}{w \times (0.8 + t/w)}\right]$$

Transmission delay time $T_4$ (ns/m)

$$T_4 = 3.34 \times \sqrt{\epsilon_r}$$

where, $\epsilon_r$ represents a dielectric constant of the insulating layer, h represents a thickness of the insulating layer (μm), and w and t represent a width and a thickness (μm) of a signal line, respectively. This time, the calculation was effected assuming that w and t are 50 and 30 μm, respectively. (an aspect ratio of the wiring $t/w = 0.60$)

The dielectric constant of the insulating layer was measured by an LP impedance analyzer Model 4192A (Hewlett Packard Co., Ltd.) in accordance with JIS-C-6481. A thermal decomposition temperature was measured by a high speed DTA Mode TGD-7000RH (Nippon Sinku Riko Co., Ltd.) in such a manner that a power resin specimen of 10 mg was heated up 10° C./min. in clean air to measure the weight decrease thereof, and the thermal decomposition temperature was shown by the temperature of the specimen achieved when the weight decrease was 5 wt% of the initial weight of the specimen. A thermal expansion coefficient was measured by a thermal mechanical analyzer Model TMA-1500 (Nippon Sinku Riko Co., Ltd.) in such a manner that a resin plate of 6×6 mm was cut and heated up 2° C./min. and the coefficient was determined by a thermal expansion curve in the range from 40° to 220° C.

TABLE 1

| Item | EXAMPLE 1 | EXAMPLE 2 | EXAMPLE 3 | EXAMPLE 4 | COMPARATIVE EXAMPLE 1 |
|---|---|---|---|---|---|
| Dislocation between layers (Horizontal Direction) | Small | Small | Small | Small | Large |
| Adhesive sheet Thickness (μm/sheet) | 16 | 15 | 18 | 15 | 55 |
| Board Thickness (μm) | 55 | 55 | 55 | 42 | 55 |
| Multi-layer Thickness (μm) | 147 | 147 | 143 | 130 | 225 |
| Dielectric Constant of Resist Portion | 2.6 | 2.9 | 2.7 | 2.8 | 3.5 |
| Dielectric Constant of Adhesive Layer Portion | 2.1 | 2.3 | 2.5 | 2.2 | 3.5 |
| Characteristic Impedance (ohm) | 53.6 | 50.5 | 50.5 | 46.9 | 66.5 |
| Transmission Delay Time (ns/m) | 5.2 | 5.5 | 5.4 | 5.4 | 6.2 |
| Thermal Expansion Coefficient | 8.0 | 9.5 | 9.0 | 10.5 | 8.0 |

TABLE 1-continued

| Item | EXAMPLE 1 | EXAMPLE 2 | EXAMPLE 3 | EXAMPLE 4 | COMPARATIVE EXAMPLE 1 |
|---|---|---|---|---|---|
| $\times 10^6 (K^{-1})$ | | | | | |
| Thermal Decomposition Temperature (°C.) | 400 | 450 | 420 | 480 | 400 |

As shown in Table 1, the EXAMPLEs of the invention greatly improve the dislocation between the layers of the obtained multi-layer boards as compared with the COMPARATIVE EXAMPLE using the prepreg including the glass fabric as the adhesive layer, because the multi-layer bonding thereof could be effected at a lower pressure. Further, since the multi-layer circuit boards according to the present invention can simultaneously reduce a dielectric constant and a thickness of the insulating layer, and further can reduce a transmission delay time to 5.5 ns/ms or less while keeping a characteristic impedance to a low level of about 55 ohms, they can effectively increase a signal transmission speed.

EXAMPLE 5

A multi-layer board for a pin grid array was made by mounting LSI chips on the multi-layer board obtained by EXAMPLE 1. This board has a 6-layer structure consisting of 2 surface layers, 2 power supply layers and 2 signal layers.

EXAMPLE 6

A microchip carrier multi-layer board on which LSI chips were mounted was made using the multi-layer board obtained by EXAMPLE 1. This board has a 6-layer structure consisting of 2 surface layers, 2 power supply layers and 2 signal layers.

EXAMPLE 7

A module board on which the microchip carrier multi-layer boards obtained by EXAMPLE 6 were mounted was made using the multi-layer board obtained by EXAMPLE 2. This board has a 36-layer structure consisting of 2 surface layers, 10 power supply layers, 16 signal layers, and 8 enlarged layers. In addition, 80 pieces (9×9) of the above microchip carrier multi-layer boards can be mounted on the module board.

EXAMPLE 8

A large area board on which the module boards obtained by EXAMPLE 7 were mounted was made using the multi-layer circuit board obtained by EXAMPLE 2. This board has a 54-layer structure consisting of 2 surface layers, 20 power supply layers, 24 signal layers, and 8 enlarged layers. In addition, 64 pieces (8×8) of the above module boards can be mounted on the large area board.

EXAMPLE 9

A large area board on which the module boards obtained by EXAMPLE 7 were mounted was made using the multi-layer board obtained by EXAMPLE 4. This board has a 46-layer structure consisting of 2 surface layers, 16 power supply layers, 20 signal layers, and 8 enlarged layers. In addition, 36 pieces (6×6) of the above module boards can be mounted on the large area board.

Figure 2:
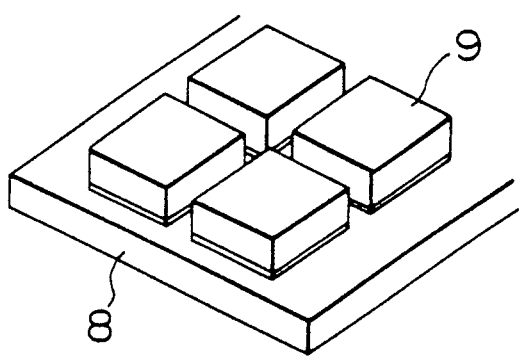
FIGS. 2 and 3 are diagrams illustrative of a mounting structure of an large area board, a module board, and a microchip carrier board to which the multilayer circuit board according to the present invention is applied.
Figure 3:
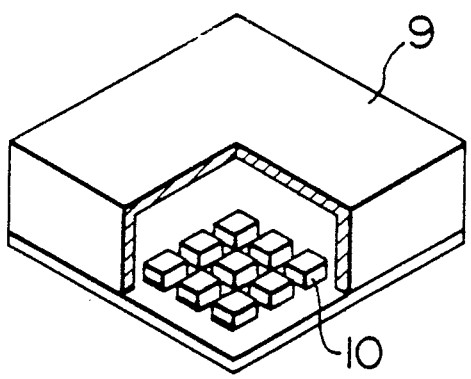

FIG. 1 shows a vertical cross sectional view of the multi-layer circuit boards obtained by EXAMPLE 1 to EXAMPLE 4. Further, FIG. 2 shows a mounting structure of the module board and the large area board obtained by EXAMPLEs 7 and 8, and FIG. 3 shows an example of the microchip carrier board.

According to the present invention, a multi-layer circuit board, which has such electric characteristics that an insulating layer has a low dielectric constant and a characteristic impedance is lowered, transmits signals at a high speed and consumes less electric power, can be made simply in a relatively short time. Further, microcircuits having a high aspect ratio can be accurately formed to multi-layers without causing almost no dislocation therebetween.

The multi-layer board obtained by the manufacturing method according to the present invention is applicable to a module board, microchip carrier board, pin grid array board, and large area board on which LSI chips are mounted.

The application of different types of the high density boards according to the present invention enables the development of a computer of a relatively small size which has a performance capable of carrying out an ultra-high speed arithmetic operation and consumes less electric power.

According to the present invention, a multilayer circuit board having almost no dislocation between respective layers can be provided by a manufacturing method by which inner layer members each including on at least one surface thereof a conductive layer having a circuit formed thereon are bonded and laminated together through adhesive films interposed therebetween, the adhesive films being composed of a varnish unpenetrating organic substance and having adhesive disposed on both surfaces thereof, and the adhesive having a melting temperature lower than a laminating temperature.

Further, the multi-layer circuit according to the present invention is applicable to a module board, microchip carrier board, pin grid array board, and large area board on which LSI chips are directly mounted.

The application of different types of the high density boards enables the development of a computer of a relatively small size which has a performance capable of carrying out an ultra-high speed arithmetic operation and consumes less electric power.

What is claimed is:

1. A multi-layer circuit board, comprising a plurality of layer members each including an insulating board having a conductive layer on at least one of two opposing surfaces thereof, said conductive layer being in the form of a circuit which is substantially flattened, films interposed between said layer members, each of said films comprising a plurality of layers including a layer of an organic substance to which varnish is impenetrable and adhesive layers disposed on respective opposite surfaces of the organic substance said adhesive layers having a melting point lower than a temperature for laminating said members and films to form said multi-layer circuit board, said films and layer members being laminated to one another in said multi-layer circuit board.

2. A multi-layer circuit board, comprising a plurality of layer members each including an insulating board having on at least one of two opposing surfaces thereof a conductive layer in the form of a circuit which is substantially flattened, sheets interposed between layer members, each of said sheets comprising a plurality of layers including a layer of an organic substance to which varnish is impenetrable and adhesive layers disposed on each of two opposing surfaces of said organic substance, said sheets and layer members being laminated to one another in said multi-layer circuit board.

3. A multi-layer circuit board, comprising a plurality of layer members each including an insulating board having a conductive layer forming a circuit surface which is substantially flattened on at least one of two opposing surfaces of the insulating board, films interposed between said layer members, each of said films comprising a plurality of layers including a layer of organic substance to which varnish is impenetrable and adhesive layers disposed on respective opposite surfaces of said organic substance, said adhesive layers having a melting point lower than a temperature for laminating said members and films to form said multi-layer circuit board, said films and layer members being laminated to one another in said multi-layer circuit board, and said multi-layer circuit board having a characteristic impedance of 60 ohms or less.

4. A multi-layer circuit board according to any one of claims 1, 2, or 3 wherein the board is a module board having LSI elements mounted thereon.

5. A multi-layer circuit board according to any one of claims 1, 2, or 3 wherein the board is a microchip carrier board having LSI elements mounted thereon.

6. A multi-layer circuit board according to any one of claims 1, 2, or 3 wherein the board is a pin grid array board having LSI elements mounted thereon.

* * * * *